(12) United States Patent
Ogasawara

(10) Patent No.: US 9,214,910 B2
(45) Date of Patent: Dec. 15, 2015

(54) INTEGRATED CIRCUIT

(71) Applicant: KABUSHIKI KAISHA TOSHIBA, Minato-ku (JP)

(72) Inventor: Yosuke Ogasawara, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 75 days.

(21) Appl. No.: 14/050,834

(22) Filed: Oct. 10, 2013

(65) Prior Publication Data

US 2014/0035683 A1 Feb. 6, 2014

Related U.S. Application Data

(62) Division of application No. 13/422,239, filed on Mar. 16, 2012, now Pat. No. 8,581,666.

(30) Foreign Application Priority Data

Oct. 28, 2011 (JP) ................................ 2011-237888

(51) Int. Cl.
*H03F 1/52* (2006.01)
*H03G 1/00* (2006.01)

(52) U.S. Cl.
CPC ............... *H03G 1/0017* (2013.01); *H03F 1/52* (2013.01)

(58) Field of Classification Search
CPC ....................................................... H03F 1/52
USPC ................................ 330/298, 207 P, 285, 296
See application file for complete search history.

(56) References Cited

U.S. PATENT DOCUMENTS

| | | | | |
|---|---|---|---|---|
| 4,644,293 A | * | 2/1987 | Kennett | 330/296 |
| 5,164,679 A | * | 11/1992 | Dittmer | 330/298 |
| 6,720,831 B2 | * | 4/2004 | Dening et al. | 330/298 |
| 6,980,408 B2 | | 12/2005 | Sakihama et al. | |
| 6,982,602 B2 | | 1/2006 | Burns | |
| 7,348,854 B1 | * | 3/2008 | Mordkovich | 330/298 |
| 7,397,309 B2 | | 7/2008 | Tanoi | |
| 8,380,147 B2 | | 2/2013 | Buescher et al. | |

(Continued)

FOREIGN PATENT DOCUMENTS

CN 2849790 Y 12/2006
CN 101826511 A 9/2010

(Continued)

OTHER PUBLICATIONS

Office Action issued on Dec. 24, 2014 in the corresponding Japanese Patent Application No. 2011-237888 (with English Translation).

(Continued)

*Primary Examiner* — Henry Choe
(74) *Attorney, Agent, or Firm* — Oblon, McClelland, Maier & Neustadt, L.L.P.

(57) ABSTRACT

According to one embodiment, provided are an amplifier transistor configured to amplify an input signal; a biasing circuit configured to set a bias voltage in such a manner as to allow the amplifier transistor to perform amplification; an electrostatic protective circuit configured to set the bias voltage for the amplifier transistor in such a manner as to make the amplifier transistor to turn off based on voltage to be applied to the amplifier transistor; and a switching circuit configured to switch the bias voltage for the amplifier transistor based on a power supply condition.

14 Claims, 4 Drawing Sheets

(56) References Cited

U.S. PATENT DOCUMENTS

| | | | |
|---|---|---|---|
| 8,416,969 B2 | 4/2013 | Enjalbert et al. | |
| 8,581,666 B2 * | 11/2013 | Ogasawara | 330/296 |
| 8,644,777 B2 * | 2/2014 | Ripley et al. | 455/117 |
| 2005/0030688 A1 | 2/2005 | Sakihama et al. | |
| 2006/0226910 A1 | 10/2006 | Tanoi | |
| 2010/0309594 A1 | 12/2010 | Sadamatsu et al. | |

FOREIGN PATENT DOCUMENTS

| | | |
|---|---|---|
| JP | 10-335947 | 12/1998 |
| JP | 2005-56892 A | 3/2005 |
| JP | 2005-93496 A | 4/2005 |
| JP | 2006-270466 A | 10/2006 |
| JP | 2008-198773 A | 8/2008 |
| JP | 2009-225167 A | 10/2009 |
| JP | 2010-283182 A | 12/2010 |

OTHER PUBLICATIONS

Office Action issued Feb. 2, 2015 in Chinese Patent Application No. 201210243483.9 (with English translation).

* cited by examiner

INTEGRATED CIRCUIT

CROSS-REFERENCE TO RELATED APPLICATIONS

This application is a divisional of U.S. application Ser. No. 13/422,239 filed Mar. 16, 2012, and is based upon and claims the benefit of priority from Japanese Patent Application No. 2011-237888, filed on Oct. 28, 2011; the entire contents of each of which are incorporated herein by reference.

FIELD

Embodiments disclosed herein generally relate to integrated circuits.

BACKGROUND

As a preventive method for protecting integrated circuits from electrostatic destruction due to static electricity, a protective device is provided in some cases for diverting surge current. Even in this case of providing a protective device to divert surge current, the integrated circuit may be subject to static destruction if the integrated circuit includes a path that allows surge current to pass therethrough.

DETAILED DESCRIPTION

In general, according to one embodiment, integrated circuit includes an amplifier transistor, a biasing circuit, an electrostatic protective circuit, and a switching circuit. The amplifier transistor is configured to amplify input signals. The biasing circuit is configured to set bias voltage to allow the amplifier transistor to perform amplification. The electrostatic protective circuit is configured to set the bias voltage for the amplifier transistor such that the amplifier transistor is to be turned off based on voltage to be applied to the amplifier transistor. The switching circuit is configured to switch the bias voltage for the amplifier transistor based on a power supply condition.

Integrated circuits according to embodiments are described below with reference to the drawings. It is to be noted that these embodiments are not intended to limit the scope of the present invention.

First Embodiment

Figure 1:
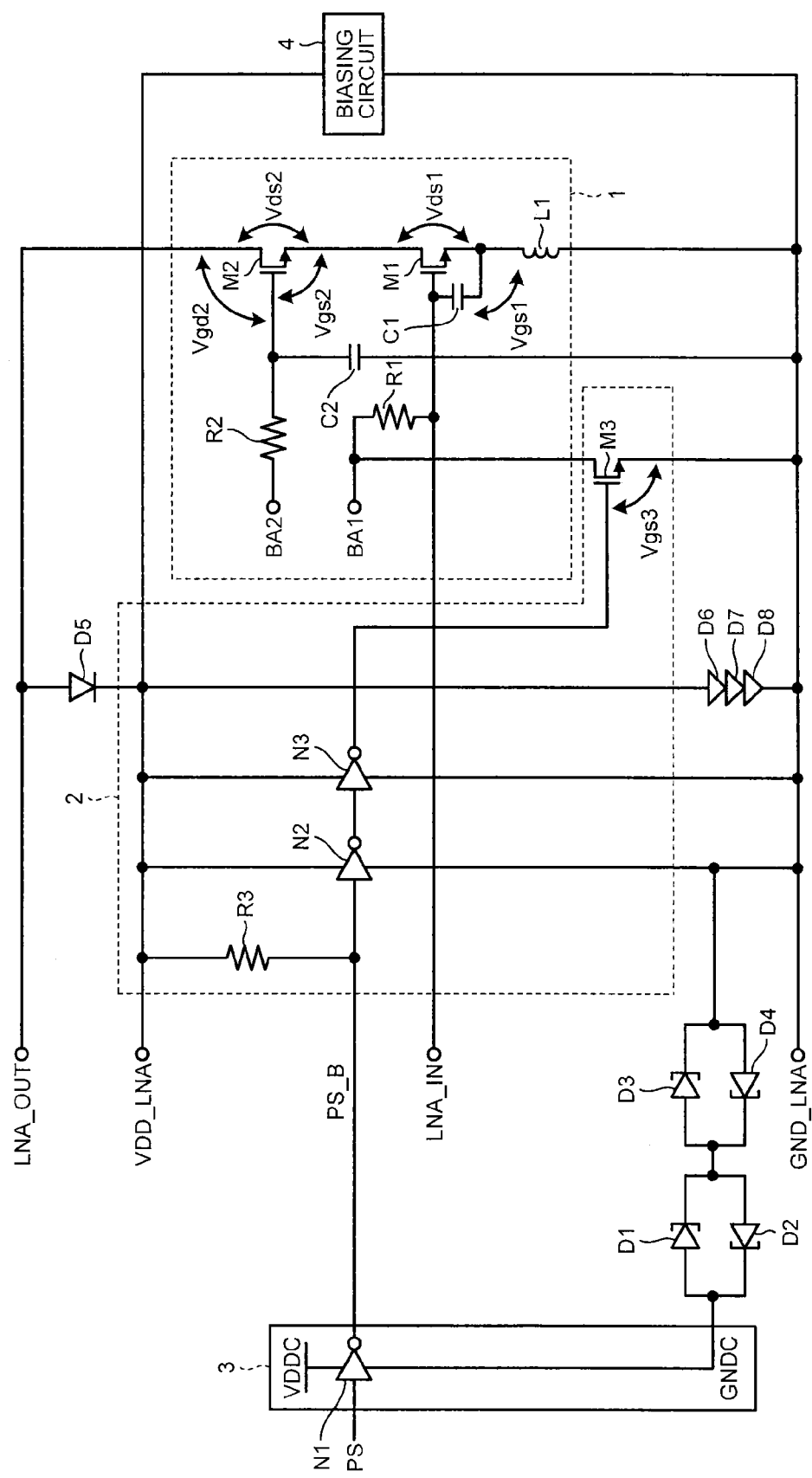
FIG. 1 is a circuit diagram illustrating the overall configuration of an integrated circuit according to a first embodiment.

FIG. 1 is a circuit diagram illustrating the overall configuration of an integrated circuit according to a first embodiment.

In FIG. 1, the integrated circuit includes an amplifier circuit 1, an electrostatic protective circuit 2, a switching circuit 3, and a biasing circuit 4. The integrated circuit also includes diodes D1 to D8 as electrostatic protective devices.

The amplifier circuit 1 is capable of amplifying input signals. The amplifier circuit 1 herein includes amplifier transistors M1 and M2, resistors R1 and R2, an inductor L1, and capacitors C1 and C2. For example, an n-channel field effect transistor (FET) may be used for the amplifier transistors M1 and M2.

The amplifier transistors M1 and M2 are connected in series to each other. The source of the amplifier transistor M1 is coupled to a ground terminal GND_LNA through the inductor L1. The capacitor C1 is connected between the gate and source of the amplifier transistor M1. The gate of the amplifier transistor M1 is connected with the resistor R1 so as to be applied with bias voltage BA1 through the resistor R1. The gate of the amplifier transistor M1 is connected with an input terminal LNA_IN so as to allow input signals to be inputted through the input terminal LNA_IN.

The drain of the amplifier transistor M2 is connected to an output terminal LNA_OUT. The capacitor C2 is connected between the gate of the amplifier transistor M2 and the ground terminal GND_LNA. The gate of the amplifier transistor M2 is connected with the resistor R2 so as to be applied with bias voltage BA2 through the resistor R2.

The biasing circuit 4 is capable of setting the bias voltages BA1 and BA2 so as to allow the amplifier transistors M1 and M2 to perform amplification. The biasing circuit 4 herein is supplied with power voltage through a power supply terminal VDD_LNA. The bias voltages BA1 and BA2 are generated at the biasing circuit 4. The bias voltage BA1 is applied to the gate of the amplifier transistor M1 through the resistor R1. The bias voltage BA2 is applied to the gate of the amplifier transistor M2 through the resistor R2.

The electrostatic protective circuit 2 is capable of setting the bias voltage BA1 for the amplifier transistor M1 such that the amplifier transistor M1 is to be turned off based on the voltage to be applied to the amplifier transistors M1 and M2. The electrostatic protective circuit 2 herein includes a switching transistor M3, inverters N2 and N3, and a resistor R3. For example, an n-channel FET may be used for the switching transistor M3. The drain of the switching transistor M3 is coupled to the gate of the amplifier transistor M1 through the resistor R1. The source of the switching transistor M3 is connected to the ground terminal GND_LNA. The inverters N2 and N3 are connected in series to each other. The input of the inverter N2 is coupled to the power supply terminal VDD_LNA through the resistor R3. The output of the inverter N3 is connected to the gate of the switching transistor M3. The inverters N2 and N3 are supplied with power voltage through the power supply terminal VDD_LNA.

The switching circuit 3 is capable of switching the bias voltage BA1 for the amplifier transistor M1 based on the supply condition of power voltage VDDC. The switching circuit 3 herein includes an inverter N1. The inverter N1 is supplied with the power voltage VDDC. Power-on signals PS are inputted to the inverter N1. The output of the inverter N1 is connected to the input of the inverter N2.

The diode D5 is connected between the output terminal LNA_OUT and the power supply terminal VDD_LNA. The diodes D6 to D8 are in serial connection. Thus, the series circuit of the diodes D6 to D8 is connected between the power supply terminal VDD_LNA and the ground terminal GND_LNA. The diodes D1 and D2 are connected in antiparallel to each other. The diodes D3 and D4 are connected in antiparallel to each other. The antiparallel circuit of the diodes D1 and D2 and the antiparallel circuit of the diodes D3 and D4 are connected in series to each other. This series circuit is connected between the ground potential GNDC of the inverter N1 and the ground terminal GND_LNA.

Figure 2:
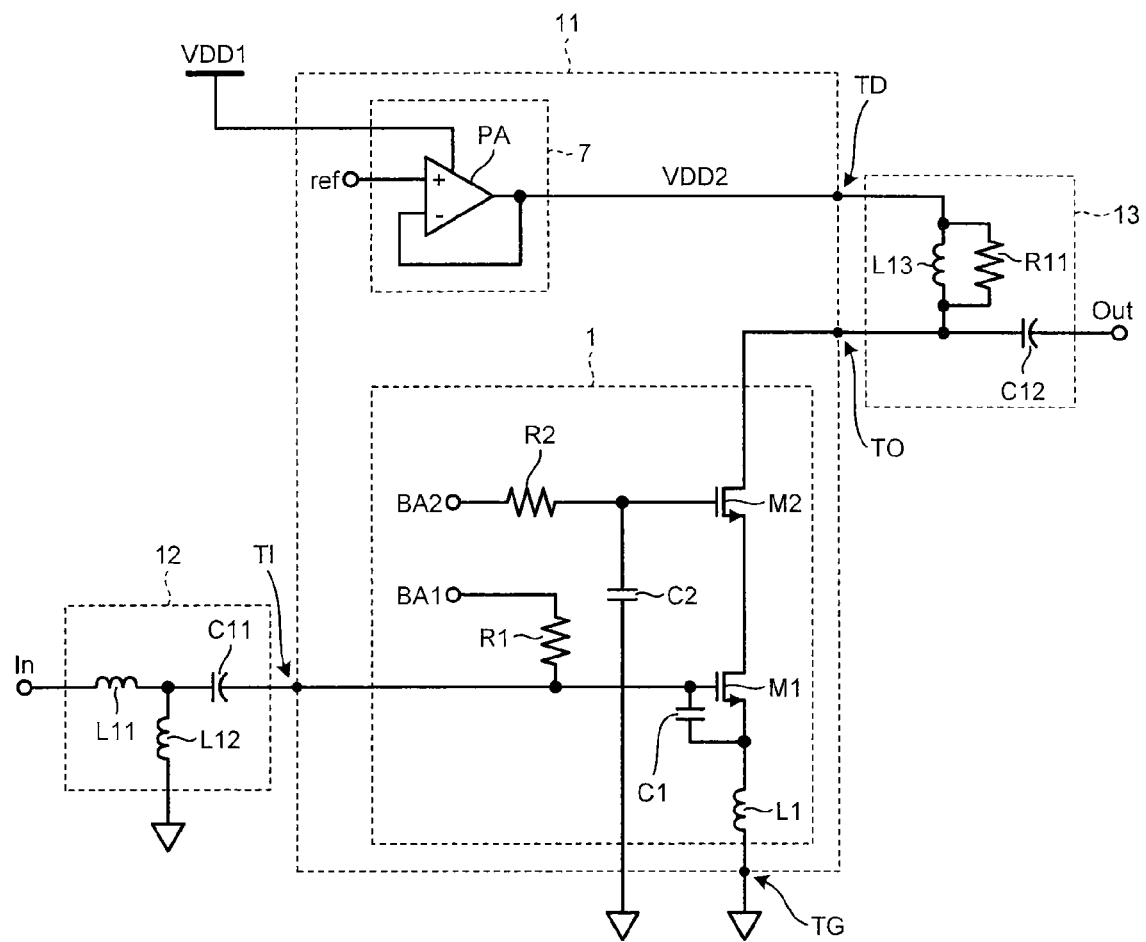
FIG. 2 is a circuit diagram illustrating a method of connecting an amplifier circuit 1 of FIG. 1 with external components 12 and 13.

FIG. 2 is a circuit diagram illustrating a method of connecting the amplifier circuit 1 of FIG. 1 with external components 12 and 13.

In FIG. 2, the amplifier circuit 1 and a regulator 7 are mounted on a semiconductor chip 11. The regulator 7 is capable of converting power voltage VDD1 to power voltage VDD2. The regulator 7 herein includes a comparator PA. The comparator PA is supplied with the power voltage VDD1 so as to compare the power voltage VDD2 with reference voltage ref.

The gate of the amplifier transistor M1 is connected to an input terminal TI. The drain of the amplifier transistor M2 is connected to an output terminal TO. The source of the amplifier transistor M1 is coupled to a ground terminal TG through the inductor L1. The output terminal of the regulator 7 is connected to a power supply terminal TD.

The input terminal TI is connected with an external component 12 for obtaining matching with input signals In. An external component 13 for obtaining matching with output signals Out is connected between the output terminal TO and the power supply terminal TD. The external component 12 herein includes inductors L11 and L12 and a capacitor C11. The input signals In are inputted to the gate of the amplifier transistor M1 sequentially through the inductor L11 and the capacitor C11. The connection point between the inductor L11 and the capacitor C11 is grounded through the inductor L12.

The external component 13 includes an inductor L13, a capacitor C12, and a resistor R11. The inductor L13 and the resistor R11 are connected to each other. The power voltage VDD2 outputted from the comparator PA is supplied to the drain of the amplifier transistor M2 through the parallel circuit of the inductor L13 and the resistor R11. The output signals Out are outputted from the drain of the amplifier transistor M2 through the capacitor C12.

The input terminal TI, the output terminal TO, the power supply terminal TD, and the ground terminal TG of the amplifier circuit 1 are exposed to the outside of the semiconductor chip 11. The input terminal TI is connected to the gate of the amplifier transistor M1 without an intervening resistor. The output terminal TO is connected to the drain of the amplifier transistor M2 without an intervening resistor. The ground terminal TG is connected to the source of the amplifier transistor M1 without an intervening resistor. Hence, surge current is directly inputted to the amplifier transistors M1 and M2.

It is to be noted that the electrostatic protective circuit 2, the switching circuit 3, and the biasing circuit 4 that are illustrated in FIG. 1 may be mounted on the semiconductor chip 11.

In FIGS. 1 and 2, power is not supplied to the semiconductor chip 11 before implementation of the semiconductor chip 11 on a circuit board. Hence, power voltage is not supplied to the biasing circuit 4 and the inverter N1, and the gate voltages of the amplifier transistors M1 and M2 and the gate voltage of the switching transistor M3 are thus inconstant.

At this time, suppose surge voltage is applied between the output terminal LNA_OUT and the ground terminal GND_LNA. If the amplifier transistors M1 and M2 are off in this state, surge current flows from output terminal LNA_OUT to the ground terminal GND_LNA through the diodes D5 to D8. Thus, surge current does not flow into the amplifier transistors M1 and M2, and the amplifier transistors M1 and M2 are protected from destruction.

Herein, if surge voltage is applied to the output terminal LNA_OUT, the potential of the power supply terminal VDD_LNA rises through the diode D5. When the potential of the power supply terminal VDD_LNA rises enough to make the biasing circuit 4 into operation, the bias voltages BA1 and BA2 are set at the biasing circuit 4 so as to turn the amplifier transistors M1 and M2 on. If the amplifier transistors M1 and M2 are turned on upon application of surge voltage to the output terminal LNA_OUT, surge current flows into the amplifier transistors M1 and M2, leading to destruction of the amplifier transistors M1 and M2.

Meanwhile, the potential of the power supply terminal VDD_LNA is detected through the resistor R3, and the voltage detected through the resistor R3 is inputted to the inverter N2. With power being not supplied to the semiconductor chip 11, a path of current to flow from the power supply terminal VDD_LNA to the resistor R3 is not generated. This allows the potential of the power supply terminal VDD_LNA to be inputted to the inverter N2 without involving voltage drop that may be otherwise made by the resistor R3. The inverters N2 and N3 are driven based on the voltage detected through the resistor R3, such that the potential of the power supply terminal VDD_LNA is applied to the gate of the switching transistor M3. Herein, rise in potential of the power supply terminal VDD_LNA upon application of surge voltage to the output terminal LNA_OUT makes the switching transistor M3 to turn on. Thus, the bias voltage BA1 for the amplifier transistor M1 becomes 0 V and the gate potential of the amplifier transistor M1 becomes 0 V. Hence, the amplifier transistor M1 is turned off, allowing for prevention of surge current from flowing into the amplifier transistors M1 and M2.

For example, suppose a surge voltage of 6 V is applied between the output terminal LNA_OUT and the ground terminal GND_LNA and the surge voltage is applied to the power supply terminal VDD_LNA through the diode D5 to bring the potential of the power supply terminal VDD_LNA to 4.5 V. At this time, a power voltage of 4.5 V is applied to the biasing circuit 4, and bias voltages BA1 and BA2 of 0 V to 4.5 V are generated at the biasing circuit 4.

Meanwhile, the potential of the power supply terminal VDD_LNA is transmitted to the inverter N2 through the resistor R3, and a voltage of 4.5 V is inputted to the inverter N2. When the voltage of 4.5 V is inputted to the inverter N2, the gate potential of the switching transistor M3 is set to 4.5 V through the inverters N2 and N3. Thus, gate-to-source voltage Vgs3 of the switching transistor M3 becomes 4.5 V, causing the switching transistor M3 to turn on. As a result, the bias voltage BA1 for the amplifier transistor M1 becomes 0 V, and the bias voltage BA1 is applied to the gate of the amplifier transistor M1 through the resistor R1, bringing the gate-to-source voltage Vgs1 of the amplifier transistor M1 to 0 V and turning the amplifier transistor M1 off. At this time, assuming the amplifier transistor M2 is turned on and the drain-to-source voltage Vds2 of the amplifier transistor M2 has become 0 V, the drain-to-source voltage Vds1 of the amplifier transistor M1 makes 6 V.

Meanwhile, when the semiconductor chip 11 is mounted on a circuit board, power is supplied to the semiconductor chip 11. Thus, power voltage VDDC is supplied to the inverter N1, and power voltage is supplied to the biasing circuit 4 through the power supply terminal VDD_LNA.

When power-on signals PS reach High level, the outputs PS_B from the inverter N1 come to Low level. When power voltage is supplied to the power supply terminal VDD_LNA, the power voltage of the power supply terminal VDD_LNA is lowered through the resistor R3 with current being extracted to the inverter N1 through the resistor R3, and the outputs PS_B from the inverter N1 are maintained at Low level. Then, the inverters N2 and N3 are driven based on the outputs PS_B from the inverter N1, such that the potential of the ground terminal GND_LNA is applied to the gate of the switching transistor M3. This makes the switching transistor M3 to turn off, and the bias voltage BA1 for the amplifier transistor M1 is set through the biasing circuit 4.

When power voltage is supplied to the biasing circuit 4, the bias voltages BA1 and BA2 are set so as to allow the amplifier transistors M1 and M2 to perform amplification. Then, input signals are applied to the gate of the amplifier transistor M1, causing current to flow into the amplifier transistors M1 and M2 in response to the input signals, such that the output signals corresponding to the current are outputted through the output terminal LNA_OUT. The amplifier transistor M2 herein may be so configured that drain current extracted from the amplifier transistor M1 is kept from returning to the amplifier transistor M1.

The source current of the amplifier transistor M1 is transformed to voltage through the inductor L1 and fed back to the gate of the amplifier transistor M1 through the capacitor C1, such that matching is attained and noise is reduced.

For example, assuming the power voltage VDD1 is 3.3 V upon application of power to the semiconductor chip 11, the voltage is converted to a power voltage VDD2 of 1.2 V at the regulator 7 and is supplied to the drain of the amplifier transistor M2 through the external component 13. Thus, the potential of the output terminal LNA_OUT is set to 1.2 V. Further, the power voltage VDD2 is applied to the power supply terminal VDD_LNA, so that the potential of the power supply terminal VDD_LNA is set to 1.2 V.

When the power voltage VDDC is supplied to the inverter N1 and the power-on signals PS reach High level, the outputs PS_B from the inverter N1 become 0 V. Then, current is drawn into the inverter N1 from the power supply terminal VDD_LNA through the resistor R3, a voltage drop by 1.2 V takes place at the resistor R3, and the potential of the power supply terminal VDD_LNA is maintained at 1.2 V.

With the potential of the power supply terminal VDD_LNA maintained at 1.2 V, a power voltage of 1.2 V is applied to the biasing circuit 4, and a bias voltage BA1 of 0.4 V is generated at the biasing circuit 4, while a bias voltage BA2 of 0.8 V is also generated.

When the outputs PS_B from the inverter N1 become 0 V, the gate potential of the switching transistor M3 is set to 0 V through the inverters N2 and N3. Thus, the gate-to-source voltage Vgs3 of the switching transistor M3 becomes 0 V, causing the switching transistor M3 to turn off. As a result, the gate potential of the amplifier transistor M1 becomes 0.4 V, and the gate-to-source voltage Vgs1 of the amplifier transistor M1 becomes 0.4 V. Further, the drain-to-source voltage Vds1 of the amplifier transistor M1 becomes 0.4 V. Moreover, the gate potential of the amplifier transistor M2 becomes 0.8 V, and the gate-to-source voltage Vgs2 of the amplifier transistor M2 becomes 0.4 V. In addition, the drain-to-source voltage Vds2 of the amplifier transistor M2 becomes 0.8 V.

Herein, the switching transistor M3 may be coupled between the source side and the gate side of the amplifier transistor M1 so as to make the switching transistor M3 to turn on upon detection of surge voltage, such that the voltage between the source and gate of the amplifier transistor M1 can be set to 0 V. Hence, the amplifier transistor M1 is prevented from being turned on upon input of surge voltage, allowing for prevention of surge current from flowing into the amplifier transistors M1 and M2. Hence, enhanced resistance to electrostatic destruction is achieved with the amplifier transistors M1 and M2.

In addition, detection sensitivity to surge voltage is enhanced by configuring such that surge voltage is detected through the resistor R3 and the inverters N2 and N3. Moreover, the switching transistor M3 may be coupled to the gate of the amplifier transistor M1 through the resistor R1, such that parasitic capacitance of the switching transistor M3 is made invisible from the side of the input terminal LNA_IN, allowing for suppression of lowering in gain and noise characteristics.

Further, with the provision of the switching circuit 3, the switching transistor M3 can be turned off upon power input, even in the case where the switching transistor M3 is turned on based on surge voltage at a point where power is yet to be inputted; thus, the amplifying functions of the amplifier transistors M1 and M2 are protected from degradation.

Second Embodiment

Figure 3:
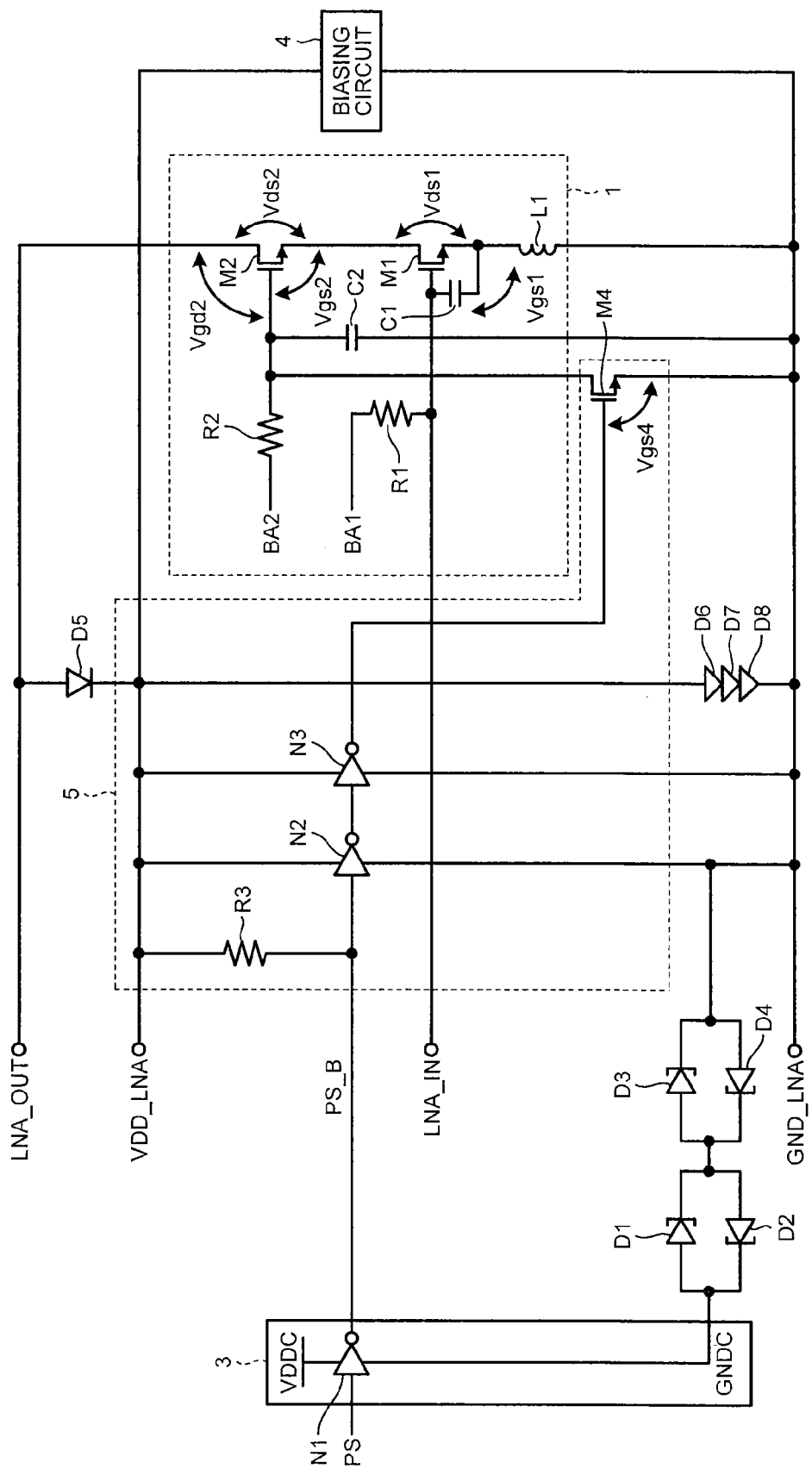
FIG. 3 is a circuit diagram illustrating the overall configuration of an integrated circuit according to a second embodiment.

FIG. 3 is a circuit diagram illustrating the overall configuration of an integrated circuit according to a second embodiment.

In FIG. 3, the integrated circuit includes an electrostatic protective circuit 5 in place of the electrostatic protective circuit 2 of the integrated circuit in FIG. 1. The electrostatic protective circuit 5 is capable of setting the bias voltage BA2 for the amplifier transistor M2 such that the amplifier transistor M2 is to be turned off based on the voltage to be applied to the amplifier transistors M1 and M2. The electrostatic protective circuit 5 herein includes a switching transistor M4 in place of the switching transistor M3. For example, an n-channel FET may be used for the switching transistor M4. The drain of the switching transistor M4 is connected to the gate of the amplifier transistor M2. The source of the switching transistor M4 is connected to the ground terminal GND_LNA. The output of the inverter N3 is connected to the gate of the switching transistor M4.

When surge voltage is applied to the output terminal LNA_OUT before implementation of the semiconductor chip 11 on a circuit board, the potential of the power supply terminal VDD_LNA rises through the diode D5. The potential of the power supply terminal VDD_LNA is detected through the resistor R3, and the voltage detected through the resistor R3 is inputted to the inverter N2. The inverters N2 and N3 are driven based on the voltage detected through the resistor R3, such that the potential of the power supply terminal VDD_LNA is applied to the gate of the switching transistor M4. Herein, rise in potential of the power supply terminal VDD_LNA upon application of surge voltage to the output terminal LNA_OUT makes the switching transistor M4 to turn on. Thus, the bias voltage BA2 for the amplifier transistor M2 becomes 0 V, and the gate potential of the amplifier transistor M2 becomes 0 V. This makes the amplifier transistor M2 to turn off, allowing for protection of the amplifier transistors M1 and M2 from inflow of surge current.

For example, suppose a surge voltage of 6 V is applied between the output terminal LNA_OUT and the ground terminal GND_LNA and the surge voltage is applied to the power supply terminal VDD_LNA through the diode D5, bringing the potential of the power supply terminal VDD_LNA to 4.5 V. At this time, a power voltage of 4.5 V is applied to the biasing circuit 4, and bias voltages BA1 and BA2 of 0 V to 4.5 V are generated at the biasing circuit 4.

Meanwhile, the potential of the power supply terminal VDD_LNA is transmitted to the inverter N2 through the resistor R3, and a voltage of 4.5 V is inputted to the inverter N2. Upon input of the voltage of 4.5 V to the inverter N2, the gate potential of the switching transistor M4 is set to 4.5 V through the inverters N2 and N3. This brings the gate-to-source voltage Vgs4 of the switching transistor M4 to 4.5 V, causing the switching transistor M4 to turn on. As a result, the bias voltage BA2 for the amplifier transistor M2 becomes 0 V and the bias voltage BA2 is applied to the gate of the amplifier transistor M2, such that the gate-to-source voltage Vgs2 of the amplifier transistor M2 becomes −0.1 V, causing the amplifier transistor M2 to turn off. At this time, suppose the gate-to-source voltage Vgs1 of the amplifier transistor M1 becomes 2 V, that the amplifier transistor M1 is turned on, and that the drain-to-source voltage Vds1 of the amplifier transistor M1 has become 0.1 V. In this case, the drain-to-source voltage Vds2 of the amplifier transistor M2 makes 5.9 V. Further, the gate-to-drain voltage Vgd2 of the amplifier transistor M2 makes 5.9 V.

Third Embodiment

Figure 4:
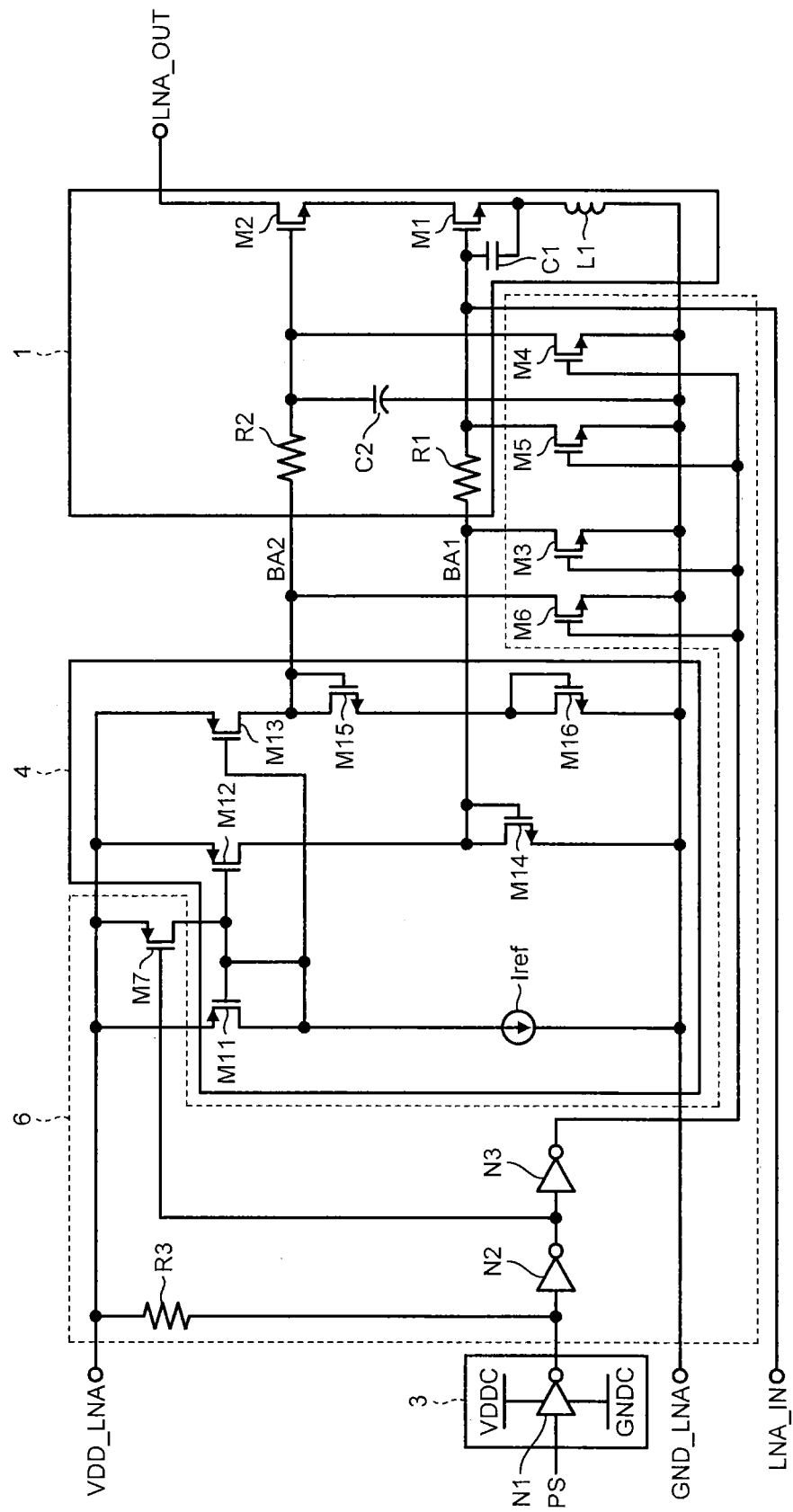
FIG. 4 is a circuit diagram illustrating the overall configuration of an integrated circuit according to a third embodiment.

FIG. 4 is a circuit diagram of the overall configuration of an integrated circuit according to a third embodiment.

In FIG. 4, the integrated circuit includes an electrostatic protective circuit 6 in place of the electrostatic protective circuit 2 of the integrated circuit in FIG. 1.

The biasing circuit 4 includes biasing transistors M11 to M16 and a current source Iref. For example, a p-channel FET may be used for the biasing transistors M11 to M13. For example, an n-channel FET may be used for the biasing transistors M14 to M16. The biasing transistors M11 to M13 herein are capable of performing current mirror operation. The biasing transistor M14 is capable of generating bias voltage BA1 based on the current mirror operation of the biasing transistor M12. The biasing transistors M15 and M16 are capable of generating bias voltage BA2 based on the current mirror operation of the biasing transistor M13.

The sources of the biasing transistors M11 to M13 are connected to the power supply terminal VDD_LNA. The drain of the biasing transistor M11 is coupled to the ground terminal GND_LNA through the current source Iref. The drain of the biasing transistor M12 is coupled to the ground terminal GND_LNA through the biasing transistor M14. The drain of the biasing transistor M13 is coupled to the ground terminal GND_LNA sequentially through the biasing transistors M15 and M16. The gates of the biasing transistors M11 to M13 are connected to the drain of the biasing transistor M11. The drain of the biasing transistor M14 is connected to the gate of the biasing transistor M14 and is also coupled to the gate of the amplifier transistor M1 through the resistor R1. The drain of the biasing transistor M15 is connected to the gate of the biasing transistor M15 and is also coupled to the gate of the amplifier transistor M2 through the resistor R2. The drain of the biasing transistor M16 is connected to the gate of the biasing transistor M16.

Further, the electrostatic protective circuit 6 is capable of causing the amplifier transistors M1 and M2 to turn off based on the voltage to be applied to the amplifier transistors M1 and M2, and also is capable of keeping the bias voltages BA1 and BA2 to be outputted from the biasing circuit 4 inconstant.

The electrostatic protective circuit 6 herein includes switching transistors M3 to M7, the inverters N2 and N3, and the resistor R3. For example, an n-channel FET may be used for the switching transistors M3 to M6. For example, a p-channel FET may be used for the switching transistor M7. The drain of the switching transistor M5 is connected to the gate of the amplifier transistor M1. The drain of the switching transistor M6 is coupled to the gate of the amplifier transistor M2 through the resistor R2. The sources of the switching transistors M5 and M6 are connected to the ground terminal GND_LNA. The gates of the switching transistors M5 and M6 are connected to the output of the inverter N3. The drain of the switching transistor M7 is connected to the gates of the biasing transistors M11 to M13. The source of the switching transistor M7 is connected to the power supply terminal VDD_LNA. The gate of the switching transistor M7 is connected to the output of the inverter N2.

Power is not supplied to the semiconductor chip 11 before implementation of the semiconductor chip 11 on a circuit board. Hence, power voltage is not supplied to the biasing circuit 4 and the inverter N1, and the gate voltages of the amplifier transistors M1 and M2 and the gate voltages of the switching transistors M3 to M7 are thus inconstant.

At this time, suppose surge voltage is applied to the power supply terminal VDD_LNA. The potential of the power supply terminal VDD_LNA is detected through the resistor R3, and the voltage detected through the resistor R3 is inputted to the inverter N2. The inverters N2 and N3 are driven based on the voltage detected through the resistor R3, such that the gate potentials of the switching transistors M3 to M6 are set to High level, and the gate potential of the switching transistor M7 is set to Low level. This makes the switching transistors M3 to M7 to turn on, and the gate potentials of the amplifier transistors M1 and M2 and of the biasing transistors M14 and M15 become 0 V, while the gate potentials of the biasing transistors M11 to M13 are brought to the potential of the power supply terminal VDD_LNA. This makes the biasing transistors M11 to M15 to turn off and the bias voltages BA1 and BA2 are brought to the potential of the ground terminal GND_LNA, while the amplifier transistors M1 and M2 are turned off, allowing for protection of the amplifier transistors M1 and M2 from inflow of surge current.

Meanwhile, when the semiconductor chip 11 is mounted on a circuit board, power is supplied to the semiconductor chip 11. Thus, power voltage VDDC is supplied to the inverter N1, and power voltage is supplied to the biasing circuit 4 through the power supply terminal VDD_LNA.

When the power-on signals PS reach High level, the outputs from the inverter N1 come to Low level. When power voltage is supplied to the power supply terminal VDD_LNA, the power voltage of the power supply terminal VDD_LNA is lowered through the resistor R3 with current being extracted to the inverter N1 through the resistor R3, and the outputs from the inverter N1 are maintained at Low level. Then, the inverters N2 and N3 are driven based on the outputs from the inverter N1, such that the gate potentials of the switching transistors M3 to M6 are set to Low level, and that the gate potential of the switching transistor M7 is set to High level. This makes the switching transistor M3 to M7 to turn off, and the bias voltages BA1 and BA2 for the amplifier transistors M1 and M2 are set through the biasing circuit 4 so as to allow the amplifier transistors M1 and M2 to perform amplification.

Upon application of input signals to the gate of the amplifier transistor M1, current flows into the amplifier transistors M1 and M2 in response to the input signals, and output signals corresponding to the current is outputted through the output terminal LNA_OUT.

Herein, the amplifier transistors M1 and M2 are turned off upon detection of surge voltage and the bias voltages BA1 and BA2 to be outputted from the biasing circuit 4 are brought to the potential of the ground terminal GND_LNA, such that the amplifier transistors M1 and M2 are prevented from being turned on. This allows for prevention of inflow of surge current into the amplifier transistors M1 and M2, and enhanced resistance to electrostatic destruction is achieved with the amplifier transistors M1 and M2.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An integrated circuit, comprising:
an amplifier transistor configured to amplify an input signal;
a biasing circuit configured to set a bias voltage in such a manner as to allow the amplifier transistor to perform amplification;
an electrostatic protective circuit configured to set the bias voltage for the amplifier transistor in such a manner as to make the amplifier transistor to turn off, based on a power supply voltage to be applied to the electrostatic protective circuit; and
a switching circuit configured to switch the bias voltage for the amplifier transistor based on a power supply condition,
wherein the electrostatic protective circuit includes:
a switching transistor configured to make turning on and off between a gate and a source of the amplifier transistor;
first resistance configured to detect voltage to be applied to a power source for the biasing circuit; and
a first inverter configured to drive a gate of the switching transistor in such a manner as to make the switching transistor to turn on based on the voltage to be detected through the first resistance, and
the switching circuit is configured to drive the gate of the switching transistor through the first inverter in such a manner as to make the switching transistor to turn off based on a power supply condition.

2. The integrated circuit according to claim 1, wherein the first resistance is directly connected between a power supply terminal of the power source for the biasing circuit and an input terminal of the first inverter.

3. The integrated circuit according to claim 2, wherein the switching circuit includes a second inverter having an output terminal connected to the input terminal of the first inverter, the second inverter being configured to receive a power-on signal.

4. The integrated circuit according to claim 2, wherein a drain of the switching transistor is coupled to the gate of the amplifier transistor through second resistance.

5. The integrated circuit according to claim 2, wherein an output terminal of the amplifier transistor is coupled to the power supply terminal through a diode.

6. The integrated circuit according to claim 5, comprising:
an inductor connected to the source of the amplifier transistor; and
a capacitor connected between the source and the gate of the amplifier transistor.

7. The integrated circuit according to claim 6, wherein the amplifier transistor includes:
a first amplifier transistor configured to amplify an input signal; and
a second amplifier transistor connected in series to the first amplifier transistor.

8. An integrated circuit, comprising:
an amplifier transistor configured to amplify an input signal;
a biasing circuit configured to set a bias voltage in such a manner as to allow the amplifier transistor to perform amplification;
an electrostatic protective circuit configured to set the bias voltage for the amplifier transistor in such a manner as to make the amplifier transistor to turn off, based on a power supply voltage to be applied to the electrostatic protective circuit; and
a switching circuit configured to switch the bias voltage for the amplifier transistor based on a power supply condition,
wherein the biasing circuit includes:
a first biasing transistor configured to perform current mirror operation; and
a second biasing transistor configured to generate the bias voltage for the biasing circuit based on the current mirror operation of the first biasing transistor,
the electrostatic protective circuit includes:
a switching transistor configured to make turning on and off between a gate and a source of the first biasing transistor;
first resistance configured to detect voltage to be applied to a power source for the biasing circuit; and
a first inverter configured to drive a gate of the switching transistor in such a manner as to make the switching transistor to turn on based on the voltage to be detected through the first resistance, and
the switching circuit is configured to drive the gate of the switching transistor through the first inverter in such a manner as to make the switching transistor to turn off based on a power supply condition.

9. The integrated circuit according to claim 8, wherein the first resistance is connected between a power supply terminal of the power source for the biasing circuit and an input terminal of the first inverter.

10. The integrated circuit according to claim 9, wherein the switching circuit includes a second inverter having an output terminal connected to the input terminal of the first inverter, the second inverter being configured to receive a power-on signal.

11. The integrated circuit according to claim 9, wherein a drain of the switching transistor is coupled to the gate of the amplifier transistor through second resistance.

12. The integrated circuit according to claim 9, wherein an output terminal of the amplifier transistor is coupled to the power supply terminal through a diode.

13. The integrated circuit according to claim 12, comprising:
an inductor connected to the source of the amplifier transistor; and
a capacitor connected between the source and the gate of the amplifier transistor.

14. The integrated circuit according to claim 13, wherein the amplifier transistor includes:
a first amplifier transistor configured to amplify an input signal; and
a second amplifier transistor connected in series to the first amplifier transistor.

* * * * *